United States Patent [19]

Kim

[11] Patent Number: 4,973,834
[45] Date of Patent: Nov. 27, 1990

[54] OPTICAL SWITCHING DEVICE EMPLOYING A FREQUENCY SYNCHRONOUS CIRCUIT

[75] Inventor: Chang S. Kim, Suwon, Rep. of Korea

[73] Assignee: SamSung Electronics Co., Ltd., Kyung Ki-Do, Rep. of Korea

[21] Appl. No.: 214,523

[22] Filed: Jul. 1, 1988

[30] Foreign Application Priority Data

Jul. 14, 1987 [KR] Rep. of Korea ............... 1987-7603

[51] Int. Cl.[5] .............................................. G01V 9/04
[52] U.S. Cl. ................................. 250/221; 250/222.1
[58] Field of Search ........................... 250/222, 222.1

[56] References Cited

U.S. PATENT DOCUMENTS

4,442,349 4/1984 Blom et al. ............... 250/222.1
4,797,547 1/1989 Blanc et al. ............... 250/222.1

Primary Examiner—Leon Scott, Jr.
Attorney, Agent, or Firm—Robert E. Bushnell

[57] ABSTRACT

Optical switching device for sensing an object. The optical switching device includes an oscillator, an light-emitting circuit for emitting a light pulse train corresponding to a pulse train from the oscillator to the object, a light-receiving circuit for converting the light pulse train depending on the presence of the object into an electrical detection pulse train, a synchronous circuit for synchronizing the frequency of the detection pulse train with an adjustable frequency to provide a certain logic signal in synchronism, and a switching circuit for generating object detection logic signals in response to the logic signal from the synchronous circuit.

39 Claims, 6 Drawing Sheets

OPTICAL SWITCHING DEVICE EMPLOYING A FREQUENCY SYNCHRONOUS CIRCUIT

FILED OF THE INVENTION

The present invention relates to a optical switching device for detecting the presence of a detecting object and in particular to an optical switching device capable of precisely providing switching control signals depending on the presence of the detecting object which are produced from synchronization of the frequency of received signals according to the presence of the object with adjustable frequency in a frequency detector.

BACKGROUND OF THE INVENTION

Conventionally, mechanical devices such as, a microswitch or a limit-switch, have been used to detect the presence of a detecting object or changes of the situation thereof through contact with the object. However, the improvement in the energy-saving views has required devices capable of performing functions not only to detect objects containing less voluminous objects at a certain distance without mechanical contact, but also to respond quickly for detection of the objects. As a result, electrical non-contact type switches were introduced.

Figure 1A:
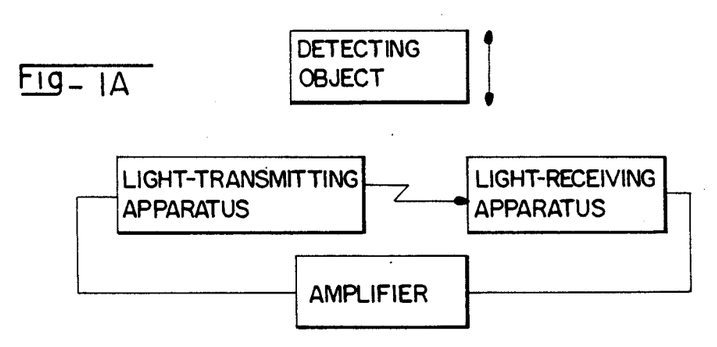
FIGS. 1(A), 1(B) and 1(C) are drawings of conventional optical switching devices types.
Figure 1B:
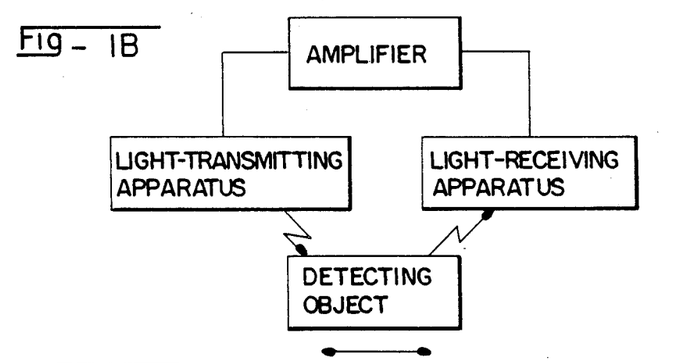
Figure 1C:
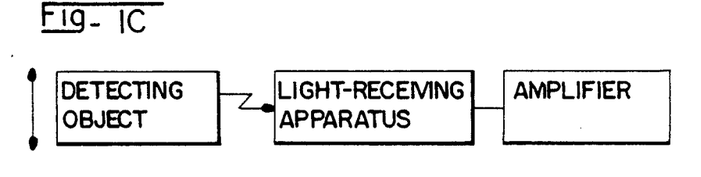

Among the non-contact type switches, optical switching devices have advantages of long distance detection and a rapid response time. Such optical switching devices are those of transmission-type, reflection-type and radiation-type as shown in FIGS. 1(A), 1(B) and 1(C) and so on.

Figure 2:
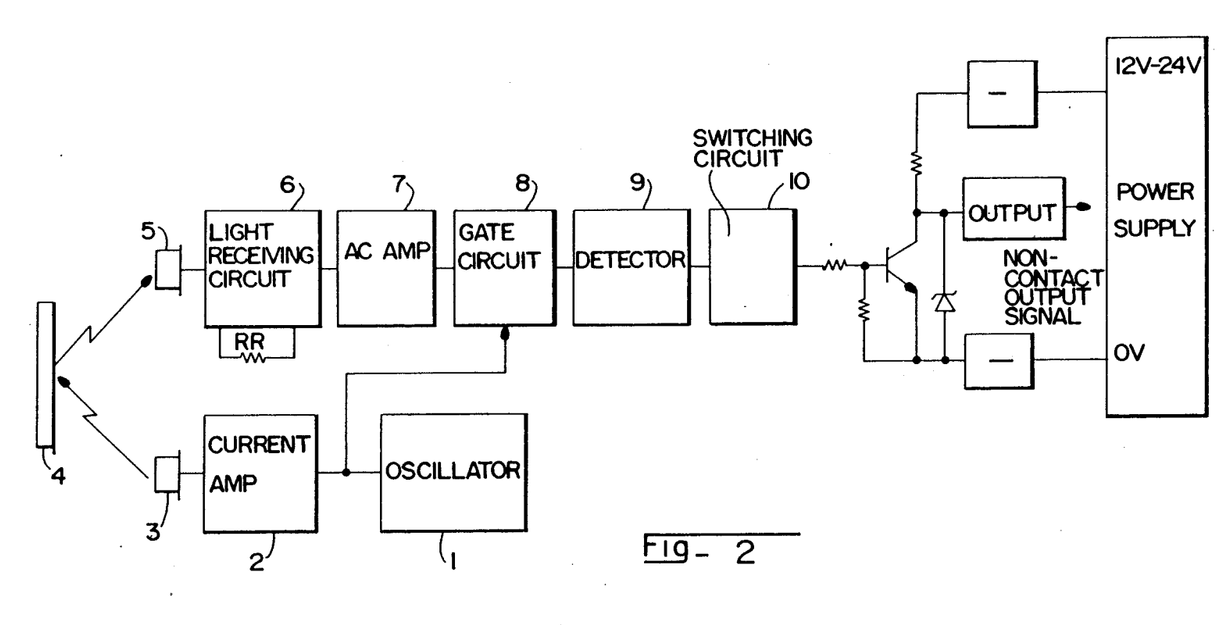
FIG. 2 shows a schematic block diagram of a conventional optical swiching device.

Referring to FIG. 2, it depicts a schematic block diagram of a conventional optical switching device for a light modulation type (E3S type) employing an infrared light-emitting diode (hereinafter referred to as "LED") which was developed in Japan and realized by a custom integrated circuit. FIG. 3(A) through FIG. 3(G) illustrate a waveform timing diagram of each part of FIG. 2.

Figures 3A, 3B:
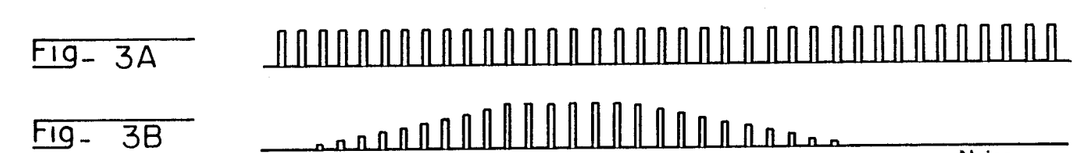
Figure 3C:
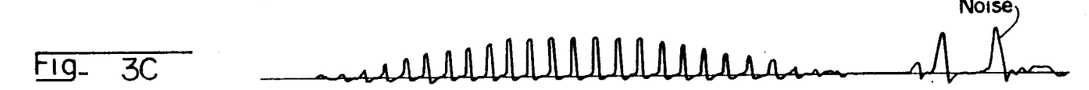
Figure 3D:
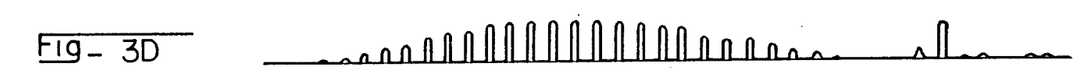
Figure 3E:
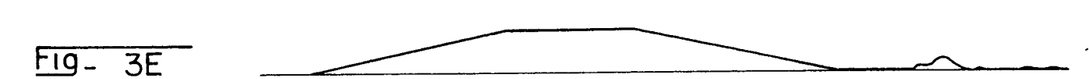
Figure 3F:
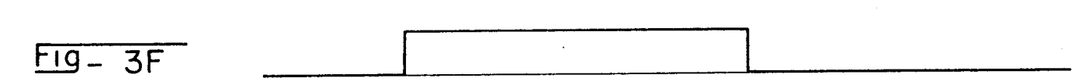
Figure 3G:
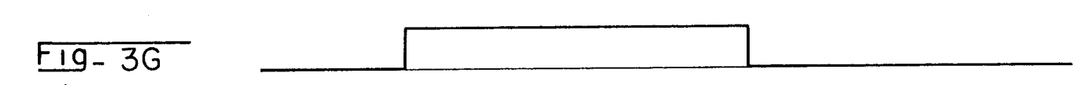

A pulse train generated by an oscillator 1 as shown in FIG. 3(A) is amplified by a current amplifier 2. The amplified pulse train from the amplifier 2 is supplied to an infrared LED 3 which turns on or off depending on the frequency thereof to emit an optical pulse train to a detection object 4. A reflection optical pulse train from the object 4 as shown in FIG. 3(B) is converted into an electrical signal via a photo-transistor 5 and delivered to a light receiving circuit 6. The light receiving circuit 6 includes a variable resistor RR for adjusting the light receiving sensitivity according to the light detecting distance and provides an electrical detection pulse train as shown in FIG. 3(C) corresponding to the reflection optical pulse. The detection pulse train from the light receiving circuit 6 is amplified by an alternating current amplifier 7 and thereafter is supplied to a gate circuit 8. The gate circuit 8 synchronizes the amplified detection pulse train from the alternating current amplifier 7 with the pulse train from the oscillator 1. That is, the gate circuit 8, whenever the pulse from the oscillator 1 is high, makes the amplified detection pulse train from the amplifier 7 pass through and then provides a gated pulse train as shown in FIG. 3(D). A detector 9 receives and converts the gated pulse train into a direct current detection signal as shown in FIG. 3(E). A switching circuit 10 compares the detection signal from the detector 9 with a predetermined potential level so as to eliminate noise signals and then provides a switching ON/OFF control signal as shown in FIG. 3(F). Therefore, the switching circuit 10 provides a logic high level at the time of the presence of the detecting object, while the switching circuit 10 provides a logic low level at the time of the absence of the object.

Therefore, since the conventional optical switching device employs a gate circuit for gating the detection pulse train with the pulse train from the oscillator arranged in a light transmitting portion and a detector for detecting the level of the gated pulse train, incorrectness of positions of the detection pulse train and the pulse train from the oscillator makes the pulse width of the gated pulse train from the gate circuit narrow and as a result, DC detection level of the detector becomes too low to sense the detected object. Also, incomplete synchronization in the gate circuit of the detection pulse train due to the delay with the pulse train from the oscillator can make the detection of a remote object impossible.

OBJECT OF THE INVENTION

The object of the invention is to provide an improved optical switching device.

It is also an object to provide an optical switching device capable of precisely synchronizing the incoming electrical detection pulse train with an adjustable free running frequency of a frequency detector so as to assure sensing of the presence of a detecting object and accomplishing a fast response thereof.

Another object of the invention is to provide an improved optical switching device capable of detecting a remote object.

SUMMARY OF THE INVENTION

These and other objects are achieved with an optical switching device having an oscillator for generating a pulse train, a light transmitter coupled to the oscillator for emitting a light pulse train corresponding to the pulse train from the oscillator, light sensor receiving the pulsed light signal according to the presence of said object and converting the pulsed light signal into an electrical detection pulse train, and a synchronous stage coupled to the light sensor for synchronizing the frequency of the detection pulse train with an adjustable free running frequency to provide a synchronized first logic signal.

BRIEF DESCRIPTION OF THE DRAWINGS

FIG. 3A-3G shows a waveform timing diagram of each part of FIG. 2;

FIGS. 6A-6G shows a waveform timing diagram of each part of FIG. 5.

DETAILED DESCRIPTION OF THE INVENTION

Figure 4:
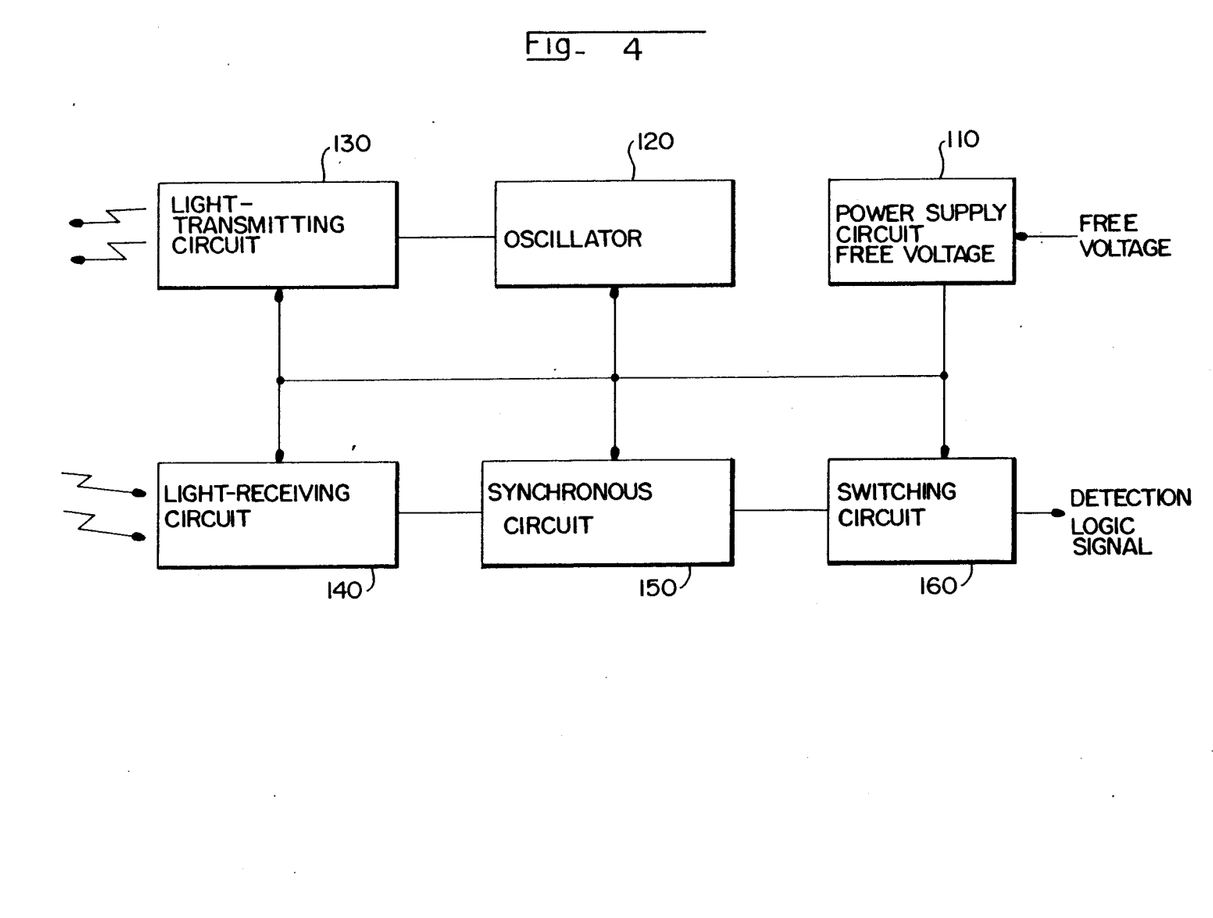
FIG. 4 shows a schematic block diagram of an optical switching device according to the present invention.

Referring to FIG. 4 represented by a block diagram form, an optical switching device according to the present invention has a power supply circuit 110 for supplying a stabilized constant power source potential with reception of free voltages (for example, 12 volts through 24 volts) to each part, an osillator 120 for generating a pulse train having a predetermined duty ratio so as to optimize the optical operation of a luminous element, a light-transmitting circuit 130 coupled to the oscillator 120 for transmitting a pulsed light signal in response to the pulse train from the oscillator to a detecting object, a light-receiving circuit 140 for converting the pulsed light signal detected according to the presence of the object into an electrical signal shaped as a pulse train which is amplified and noise elimination therefrom a synchronous circuit 150 coupled to receive the shaped pulse train from the light-receiving circuit 140 for providing a logic level signal when the frequency of the shaped pulse train is substantially equal to an adjustable free running frequency, and a switching circuit coupled to the synchronous circuit for providing object detection logic signals in response to the logic signal from the synchronous circuit so as to drive a controller.

The operation of the present invention according to the construction as mentioned will be described. The power supply circuit 110 which receives free voltage having an arbitrary amplitude in voltage ranges of 12 volts to 24 volts supplies a stabilized constant DC power source potential to the oscillator 120, the light-transmitting circuit 130, the light-receiving circuit 140, the synchronous circuit 150, and the switching circuit 160.

The oscillator 120 supplied the DC power source potential from the power supply circuit 110, generates an electrical pulse train having on ON/OFF duty ratio of one to nine. During the period of high logic state of the pulse train, the light-transmitting circuit 130 is turned on to emit a light pulse train corresponding to the electrical pulse train for detecting the presence of the detecting object.

The light-receiving circuit 140 which receives the light pulse train according to the presence of the object eliminates noise due to the natural light or a light signal except for the receivable light pulse train and at the same time provides an electrical detection pulse signal being amplified and shaped as an electrical pulse train. The synchronous circuit 150 which receives the detection pulse train from the light-receiving circuit 140 filters out low frequency components mixed with the detection pulse train and provides a predetermined logic control signal when an adjustable voltage controlled oscillator free running frequency is substantially equal to the frequency of the detection pulse train. The switching circuit 160 coupled to receive the logic control signal from the synchronous circuit 150 provides object detection logic signals for driving a controller not shown in FIG. 4.

Figure 5:
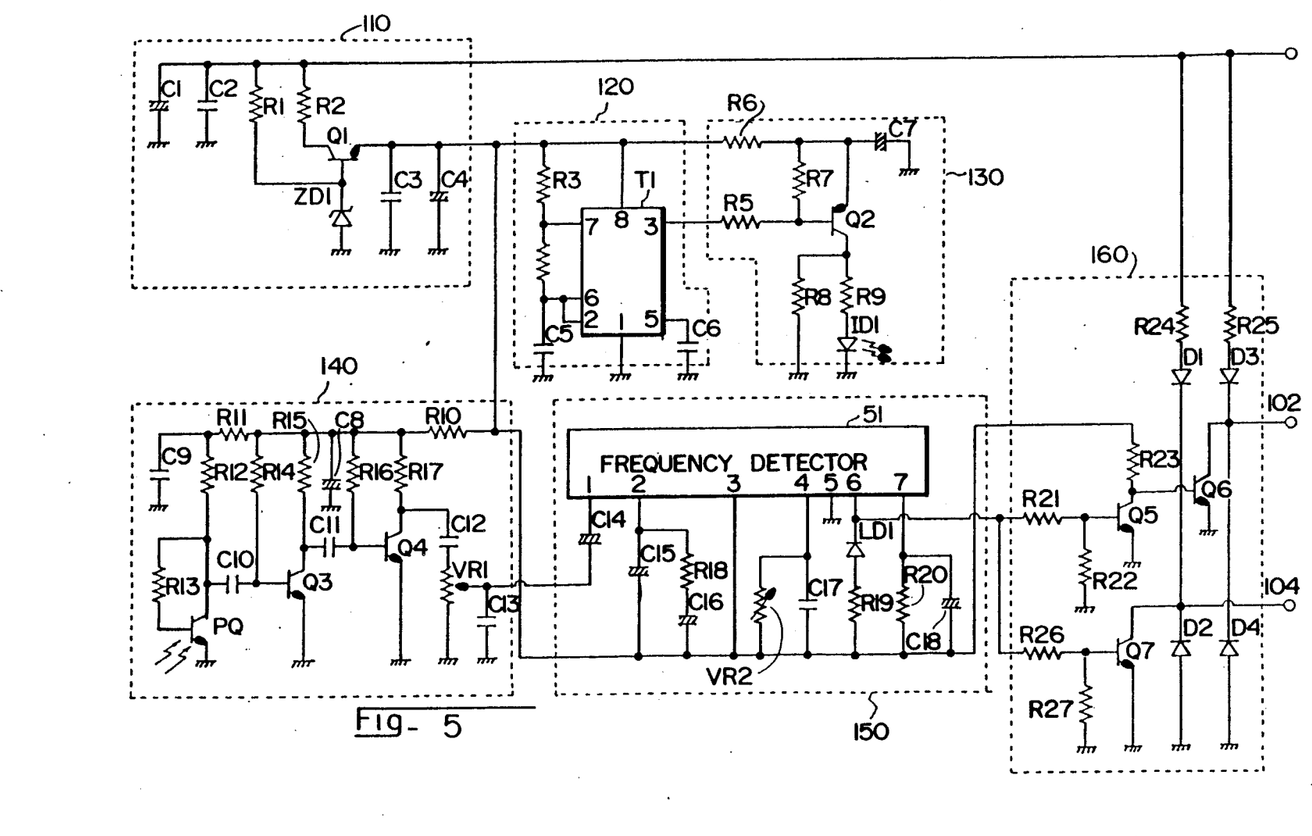
FIG. 5 shows a detailed circuit diagram of FIG. 4.

Referring to FIG. 5, this FIGURE is illustrative of a specific circuit diagram of FIG. 4, it includes power supply circuit 110 having capacitors C1 through C4, resistors R1 and R2, a zener diode ZD1 and a transistor Q1, the oscillator 120 having resistors R3 and R4, capacitors C5 and C6 and a timer T1, the light-transmitting circuit 130 having resistors R5 through R9, a capacitor C7, a transistor Q2 and an infrared LED ID1, the light-receiving circuit 140 having capacitors C8 through C13, resistors R10 through R17, variable resistor VR1, a phototransistor PQ and transistors Q3 and Q4, the synchronous circuit 150 having capacitors C14 through C18, resistors R18 through R20, a variable resistor VR2 and a LED LD1, and the switching circuit 160 having resistors R21 through R27, diodes D1 through D4 and transistors Q5 through Q7.

Referring to FIG. 6, this FIGURE represents a waveform timing diagram of each part of FIG. 5. FIG. 6(A) shows an output waveform at an output terminal 3 of the timer T1, FIG. 6(B) a light output signal from the infrared LED ID1, FIG. 6(C) an output waveform at the collector terminal of the phototransistor PQ, FIG. 6(D) a waveform applied to an input terminal 1 of the frequency detector 51, FIG. 6(E) a waveform at an output terminal 6 of the frequency detector 51, FIG. 6(F) an output waveform at the collector terminal of the transistor Q6 and FIG. 6(G) an output waveform at the collector terminal of the transistor Q7.

Now, referring to the waveform diagram of FIG. 6, the operation of the implementation circuit of FIG. 5 will be described in detail.

Referring to waveform diagrams of FIG. 6(A) through FIG. 6(G), the preferred embodiment of FIG. 5 according to the present invention will be described in more detail.

For the convenience of explanation, the type of the optical switching device applied to the present invention will be assumed to be a reflected type.

When DC power supply source potential of free voltage is applied to a power supply input terminal 100, a constant potential on the cathode side of the zener diode ZD1 through the resistor R1 is applied to the base of transistor Q1 and the transistor Q1 turns on.

Figure 6A:
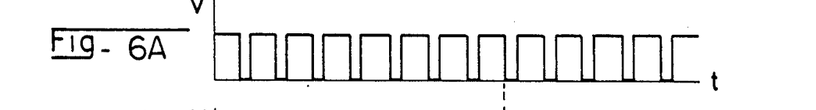
Figure 6B:
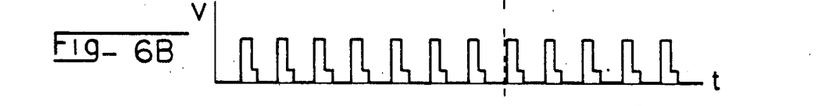

Therefore, the potential of the emitter of transistor Q1 renders a constant potential and current flows through the resistor R2 and the collector-emitter path of transistor Q1. At the initial application of power source potential, alternating current components mixed with the power source potential bypass through capacitors C1 and C2. The constant output potential from the transistor Q1 is prevented from causing a chattering phenomena through capacitors C3 and C4 and is supplied to the timer T1 as a power supply source potential. The timer T1 generates a pulse train having a predetermined duty ratio as shown in FIG. 6(A) which is determined by values of resistors R3 and R4 and capacitor C5 so as to maximize the excitation of infrared LED ID1. The pulse train from the output terminal of timer T1 is applied to the base of PNP transistor Q2 through the resistor R5. Therefore, the transistor Q2 is turned on or turned off by the pulse train and, when turned on, the current that charges capacitor C7 through the resistor R6 flows to the ground through the emitter-collector path of transistor Q2, the current limiting resistor R9 and the anode cathode path of infrared LED ID1. Therefore, the infrared LED ID1 emits a light pulse train as shown in FIG. 6(B) to the object to be detected. The resistor R8 is employed to prevent electrical destruction of the LED ID1.

The constant potential from the transistor Q1 is applied to the collector of phototransistor PQ through resistors R10 through R12 as a biasing potential. Also, since the bias potential is applied to the base of phototransistor PQ through, resistor R13, amplification characteristics of alternating current components at the time of operation thereof and the response speed can be increased.

At first, the operation in case of the absence of the detecting object will be described.

Figure 6C:
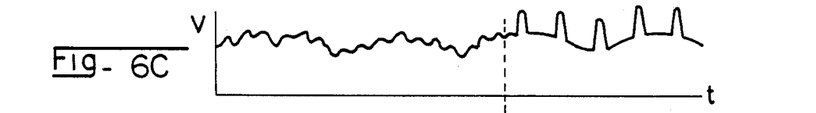
Figure 6D:
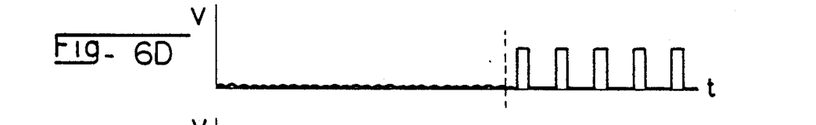
Figure 6E:
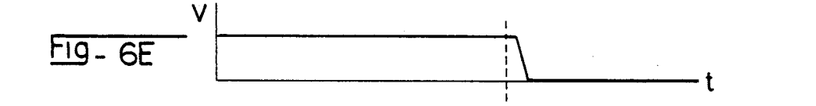
Figure 6F:
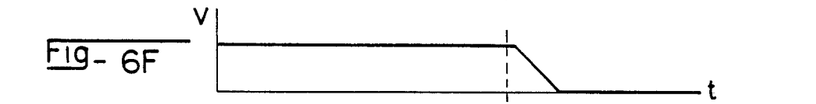
Figure 6G:
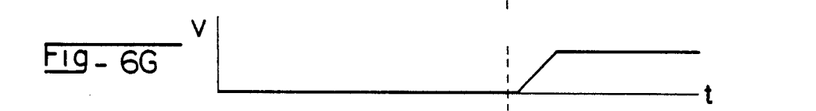

When the phototransistor PQ can not detect the light pulse train from the infrared LED ID1 as shown in FIG. 6(B), i.e., when the detecting object is absent, the input terminal 1 of frequency detector 51 remains at a logic low state as shown in FIG. 6(D). The frequency detector 51 is a commercial integrated circuit chip KA 2263 producted by SAMSUNG Semiconductor & Telecommunications Co., Ltd., which includes a phase locked loop circuit. Since the logic low state from the input terminal 1 of frequency detector 51 can not synchronize with the free running frequency of the internal voltage controlled oscillator adjusted by the variable resistor VR2, the logic high state as shown in FIG. 6(E) occurs at output terminal 6 and cause to turn off the LED LD1 so as to indicate the absence of the detecting object. The logic high state from the frequency detector 51 is applied to bases of transistors Q5 and Q7 through resistors R21 and R26 respectively. Therefore, transistor Q5 turns on and transistor Q6 turns off so that an output terminal 102 provides a logic high state as shown in FIG. 6(F) through the resistor R25 and the diode D3, while the transistor Q7 turns on so that the other output terminal 104 provides a logic low state as shown in FIG. 6(G). Diodes D2 and D4 are employed to prevent electrical destruction of transistors Q6 and Q7 due to surge voltages from a controller that maybe connected to output terminals 102 and 104.

Now, the operation in the presence of the detecting object will be described.

Once a light pulse train signal reflected from a detected object is received, the phototransistor PQ turns on or turns off in response to the light pulse train. Therefore, the collector terminal of the phototransistor PQ provides an electrically converted pulse signal with a predetermined biasing direct current component. The direct current component mixed with the electrical pulse signal from the phototransistor PQ is blocked by the capacitor C10. The portion composed of the capacitor C11, resistors R14 and R15 and the transistor Q3 and the other portion composed of the capacitor C12, resistors R16 and R17 and the transistor Q4 are respectively conventional pulse shaping circuits. The electrical pulses as shown in FIG. 6(C) are amplified and shaped into an electrical detection pulse train through the two pulse shaping circuits. Therefore, the amplitude of the pulse shaped signal from the collector of transistor Q4 is adjusted by the variable resistor VR1 through the capacitor C12 and an appropriately amplitude-adjusted pulse train as shown in FIG. 6(D) is supplied to the input terminal 1 of the frequency detector 51 through the capacitor C14. Capacitors C8, C9 and C13 are those for bypassing high frequency components corresponding to noises. The portion composed of capacitors C15 and C16 and resistor R18 connected between the emitter terminal of transistor Q1 and the pin 2 of the frequency detector 51 is a low pass filter of a phase locked loop circuit. When the free running frequency of the voltage controlled oscillator adjusted by the variable resistor VR2 is substantially equal to the frequency of the pulse train applied to input terminal 1, the output terminal 6 of the frequency detector 51 provides a logic low state as shown in FIG. 6(E), whereby turning on the LED LD1 connected thereto so as to indicate the presence of the detecting object. The resistor R20 and capacitor C18 connected to the pin 7 are those for controlling the intensity of light from the LED LD1. Therefore, since the frequency detector 51 causes synchronization of the incoming object detection pulse train with the free running frequency of the voltage controlled oscillator in the phase locked loop circuit which can be adjusted externally, the precise detection of the object can be achieved and the response speed can be increased.

The logic low state from the frequency detector 51 as shown in FIG. 6(E) is applied to the base of transistor Q5 through resistor R21 and then the transistor Q5 is turned off. Therefore, the logic high state of the collector terminal thereof is applied to the base of transistor Q6 and then the transistor Q6 is turned on so as to provide a logic low state as shown in FIG. 6(F) to the output terminal 102. At the same time, the logic low state from the frequency detector 51 is applied to the base of transistor Q7 through resistor R26 and then the transistor Q7 is turned off so as to provide a logic high state as shown in FIG. 5(G) to the other output terminal 104.

Therefore, since output logic signals from transistors Q6 and Q7 in case of the presence of the detecting object is opposite to those therefrom in case of the absence thereof, the output logic signals from the output terminals 102 and 104 applied to a controller not shown in the drawings are used as switching control logic signals for driving the controller.

The present invention can be applied to optical switching devices of detecting a semitransparent object or an opaque object.

As mentioned above, the present invention has advantages of the detection of remote objects and a high speed response because of synchronizing the frequency of the incoming object detection signal with the adjustable free running frequency of the voltage controlled oscillator.

What is claimed is:

1. An optical switching device for sensing an object, comprising:
   an oscillator for generating a first pulse train;
   light-transmitting means coupled to the oscillator for emitting light in the form of a second pulse train corresponding to the first pulse train from the oscillator, to the object;
   light-receiving means for receiving the pulsed light train according to one of the presence or absence of said object and converting the pulsed light train into an electrical detection pulse train; and
   synchronous means coupled to the light-receiving means for synchronizing the frequency of the detection pulse train with an adjustable free running frequency to provide a first logic signal when said frequency of said detection pulse train is in synchronism with said free running frequency.

2. The device of claim 1, wherein the synchronous means comprises a phase locked loop circuit.

3. The device of claim 1, wherein the light-receiving means includes one or more pulse shaping circuits.

4. The device of claim 3, wherein the light-transmitting means includes an optical element for emitting infrared light and the light-receiving means includes a light sensing element for detecting the pulsed light signal to provide an input to said pulse shaping circuits.

5. The device of claim 1 further comprising switching means coupled to the synchronous means for providing object detection logic signals in response to the first logic signal.

6. The optical switching device of claim 1, wherein said first pulse train exhibits a first frequency, said second pulse train exhibits said first frequency, said electrical detection pulse train exhibits a second frequency, and said synchronous means comprises:
   means for generating the free running frequency, and means for enabling adjustment of said free running frequency in synchronism with said second frequency.

7. The device of claim 6, wherein said light-receiving means is further comprised of:
- a first node connectable for receiving a source of constant potential;
- a first transistor responding to reception of said pulse light train to provide an intermediate pulse detection signal;
- first resistance means coupled to said first node for providing a first potential across conduction electrodes of said first transistor and a bias potential to a control electrode of said first transistor; and
- means coupled to said first resistance means, for separating any direct current component from said intermediate pulse detection signal, and for providing said electrical detection pulse train.

8. The device of claim 1, wherein said light-receiving means is further comprised of:
- a first node connectable for receiving a first potential;
- a first transistor responding to reception of said pulse light train to provide an intermediate pulse detection signal;
- first resistance means coupled to said first node for providing a second potential across conduction electrodes of said first transistor and a bias potential to a control electrode of said first transistor; and
- means coupled to said first resistance means, for separating any direct current component from said intermediate pulse detection signal, and for providing said electrical detection pulse train.

9. The optical switching device of claim 8, wherein said synchronous means is comprised of:
- a frequency detector coupled to receive said electrical detection pulse train;
- a low pass filter forming a phase locked loop with said frequency detector;
- voltage controlled means for generating an output signal exhibiting said free running frequency; and
- means for adjusting said free running frequency to substantially equal said frequency of said detection pulse train, whereby said frequency detector provides said first logic signal exhibiting one logic state when said detection pulse train is synchronized with said output signal and a second state when said detection pulse is not synchronized with said output signal.

10. The optical switching device of claim 1, wherein said synchronous means is comprised of:
- a frequency detector coupled to receive said electrical detection pulse train;
- a low pass filter forming a phase locked loop with said frequency detector;
- voltage controlled means for generating an output signal exhibiting said free running frequency; and
- means for adjusting said free running frequency to substantially equal said frequency of said detection pulse train, whereby said frequency detector provides said first logic signal exhibiting one logic state when said detection pulse train is synchronized with said output signal and a second state when said detection pulse is not synchronized with said output signal.

11. An optical switching device, comprising:
- means generating a first pulse train;
- means coupled to receive said first pulse train, for emitting a pulsed light train exhibiting a first frequency in dependence upon said first pulse train;
- means for receiving a pulsed light signal during the presence of an object illuminated by said pulsed light train and for converting said pulsed light signal into an electrical detection pulse train; and
- synchronizing means including an oscillator, coupled for receiving and synchronizing the first frequency of said detection pulse train with a free running frequency generated by said oscillator.

12. The switching device of claim 11, wherein said synchronizing means provides logic level signals indicating a relation between said frequency of said detection pulse train and said free running frequency, further comprising:
- switching means coupled to said synchronous means for providing in response to said logic level signal, detection signals indicating detection and lack of detection of the object.

13. The switching device of claim 12, wherein said receiving means further comprises:
- means for eliminating noise attendant to said pulsed light signal; and
- means for responding to said pulsed light signal by shaping an intermediate signal into said detection pulse train.

14. The switching device of claim 11, wherein said receiving means further comprises:
- means for eliminating noise attendant to said pulsed light signal; and
- means for responding to said pulsed light signal by shaping an intermediate signal into said detection pulse train.

15. The optical switching device of claim 11, wherein said first pulse train exhibits a first frequency, said second pulse train exhibits said first frequency, said electrical detection pulse train exhibits a second frequency, and said synchronizing means comprises:
- means for generating the free running frequency, and
- means for enabling adjustment of said free running frequency to substantially equal said second frequency.

16. The device of claim 15, wherein said light-receiving means is further comprised of:
- a first node connectable for receiving a constant potential;
- a first transistor responding to reception of said pulsed light signal to provide an intermediate pulse detection signal;
- first resistance means coupled to said first node for providing a first potential across conduction electrodes of said first transistor and a bias potential to a control electrode of said first transistor; and
- means coupled to said first resistance means, for separating any direct current component from said intermediate pulse detection signal, and for providing said electrical detection pulse train.

17. The device of claim 11, wherein said light-receiving means is further comprised of:
- a first node connectable for receiving a first potential;
- a first transistor responding to reception of said pulsed light signal to provide an intermediate pulse detection signal;
- first resistance means coupled to said first node for providing a second potential across conduction electrodes of said first transistor and a bias potential to a control electrode of said first transistor; and means coupled to said first resistance means, for separating any direct current component from said intermediate pulse detection signal, and for providing said electrical detection pulse train.

18. The optical switching device of claim 17, wherein said synchronizing means comprises:
a frequency detector coupled to receive said electrical detection pulse train;
a low pass filter forming a phase locked loop with said frequency detector;
voltage controlled means for generating an output signal exhibiting said free running frequency; and
means for adjusting said free running frequency to substantially equal said frequency of said detection pulse train, whereby said frequency detector provides said first logic signal exhibiting one logic state when said detection pulse train is synchronized with said output signal and a second state when said detection pulse is not synchronized with said output signal.

19. The optical switching device of claim 11, wherein said synchronizing means comprises:
a frequency detector coupled to receive said electrical detection pulse train;
a low pass filter forming a phase locked loop with said frequency detector;
voltage controlled means for generating an output signal exhibiting said free running frequency; and
means for adjusting said free running frequency to substantially equal said frequency of said detection pulse train, whereby said frequency detector provides said first logic signal exhibiting one logic state when said detection pulse train is synchronized with said output signal and a second state when said detection pulse is not synchronized with said output signal.

20. An optical switching device, comprising:
means for emitting a pulsed light train exhibiting a first pulse frequency;
means for receiving a pulsed light signal due to the presence of an object illuminated by said pulsed train and for converting said pulsed light signal into an electrical detection pulse train exhibiting a second pulse frequency; and
synchronizing means for generating a free running frequency, for receiving and synchronizing the first frequency of said detection pulse train with said free running frequency, and for providing a logic level signal when said second pulse frequency is substantially equal to said free running frequency.

21. The switching device of claim 20, further comprising switching means coupled to said synchronizing means for providing in response to said logic level signal, detection signals indicating detection and lack of detection of the object.

22. The switching device of claim 21, wherein said receiving means further comprises:
means for eliminating noise attendant to said pulsed light signal; and
means for responding to said pulsed light signal by shaping an intermediate signal into said detection pulse train.

23. The switching device of claim 20, wherein said receiving means further comprises:
means of eliminating noise attendant to said pulsed light signal; and
means for responding to said pulsed light signal by shaping an intermediate signal into said detection pulse train.

24. The optical switching device of claim 20, wherein said first pulse train exhibits a first frequency, said second pulse train exhibits said first frequency, said electrical detection pulse train exhibits a second frequency, and said synchronizing means comprises:
means for generating the free running frequency, and
means for enabling adjustment of said free running frequency in synchronism with said second frequency.

25. The device of claim 24, wherein said light-receiving means is further comprised of:
a first node connectable for receiving a source of constant potential;
a first transistor responding to reception of said pulsed light signal to provide an intermediate pulse detection signal;
first resistance means coupled to said first node for providing a first potential across conduction electrodes of said first transistor and a bias potential to a control electrode of said first transistor; and
means coupled to said first resistance means, for separating any direct current component from said intermediate pulse detection signal, and for providing said electrical detection pulse train.

26. The device of claim 20, wherein said light-receiving means is further comprised of:
a first node connectable for receiving first potential;
a first transistor responding to reception of said pulsed light signal to provide an intermediate pulse detection signal;
first resistance means coupled to said first node for providing a second potential across conduction electrodes of said first transistor and a bias potential to a control electrode of said first transistor; and
means coupled to said first resistance means, for separating any direct current component from said intermediate pulse detection signal, and for providing said electrical detection pulse train.

27. The optical switching device of claim 26, wherein said synchronous means is comprised of:
a frequency detector coupled to receive said electrical detection pulse train;
a low pass filter forming a phase locked loop with said frequency detector;
voltage controlled means for generating an output signal exhibiting said free running frequency; and
means for adjusting said free running frequency to substantially equal said frequency of said detection pulse train, whereby said frequency detector provides said first logic signal exhibiting one logic state when said detection pulse train is in synchronism with said output signal and a second logic state when said detection pulse is not in synchronism with said output signal.

28. The optical switching device of claim 20, wherein said synchronizing means is comprised of:
a frequency detector coupled to receive said electrical detection pulse train;
a low pass filter forming a phase locked loop with said frequency detector;
voltage controlled means for generating an output signal exhibiting said free running frequency; and
means for adjusting said free running frequency to substantially equal said frequency of said detection pulse train, whereby said frequency detector provides said first logic signal exhibiting one logic state when said detection pulse train is in synchronism with said output signal and a second logic state when said detection pulse is not in synchronism with said output signal.

29. A process for sensing the presence or absence of an object; comprising the steps of:
generating a first pulse train exhibiting a first frequency;
providing illumination of a location with a pulsed light train exhibiting said first frequency, in dependence upon said first pulse train;
receiving a light signal resulting from said illumination, with resulting light signal being a pulsed light signal during one of the presence or absence within said location of an object provided illumination by said pulsed light train;
converting said pulsed light signal into an electrical detection pulse train exhibiting a second frequency; and
generating an intermediate signal exhibiting a free running frequency;
adjusting said free running frequency to substantially equal said second frequency;
providing an output signal indicative of whether said electrical detection pulse train is in synchronism with said intermediate signal.

30. The process of claim 29, further comprised of:
converting said resulting light signal into said electrical detection pulse train whereby said detection pulse train exhibits a first and lower amplitude when said resulting light signal is not a pulsed light signal, and a second and greater amplitude when said resulting light signal is a pulse light signal.

31. An optical switching device, comprising:
means including an oscillator, for generating a first pulse train exhibiting a first frequency;
means coupled to receive said first pulse train, for emitting a pulsed light train exhibiting said first frequency, in dependence upon said first pulse train;
means for receiving a pulsed light signal during one of the presence or absence of an object with a location illuminated by said pulsed light train, and for converting said pulsed light signal into an electrical detection pulse train exhibiting a second frequency; and
synchronizing means including a second oscillator providing a local signal exhibiting a free running frequency and means for adjusting said free running frequency, coupled for receiving and in response to occurrence of synchronization of said local signal with said electrical detection pulse train providing an output signal indicative of whether said detection pulse train is synchronized with said local signal.

32. The device of claim 31, wherein said synchronizing means comprises a phase locked loop circuit.

33. The device of claim 31, wherein said output signal comprises logic level signals indicating a relation between said frequency of said detection pulse train and said free running frequency, wherein said synchronizing means comprises:
switching means coupled to said synchronous means for providing, in response to said output signal, detection signals indicating detection and lack of detection of the object.

34. The device of claim 31, wherein said receiving means further comprises:
means for eliminating noise attendant to said pulsed light signal; and
means for responding to said pulsed light signal by shaping an intermediate signal into said detection pulse train.

35. The optical switching device of claim 31, wherein said first pulse train exhibits a first frequency, said second pulse train exhibits said first frequency, said electrical detection pulse train exhibits a second frequency, and said free running frequency is substantially equal to said second frequency.

36. The device of claim 35, wherein said light-receiving means is further comprised of:
a first node connectable for receiving a constant potential;
a first transistor responding to reception of said pulsed light signal to provide an intermediate pulse detection signal;
first resistance means coupled to said first node for providing a first potential across conduction electrodes of said first transistor and a bias potential to a control electrode of said first transistor; and
means coupled to said first resistance means, for separating any direct current component from said intermediate pulse detection signal, and for providing said electrical detection pulse train.

37. The device of claim 31, wherein said receiving means further comprises:
a first node connectable for receiving first potential;
a first transistor responding to reception of said pulsed light signal to provide an intermediate pulse detection signal;
first resistance means coupled to said first node for providing a second potential across conduction electrodes of said first transistor and a bias potential to a control electrode of said first transistor; and
means coupled to said first resistance means, for separating any direct current component from said intermediate pulse detection signal, and for providing said electrical detection pulse train.

38. The optical switching device of claim 31, wherein said synchronizing means comprises:
a frequency detector coupled to receive said electrical detection pulse train;
a low pass filter forming a phase locked loop with said frequency detector;
voltage controlled means for generating an output signal exhibiting said free running frequency; and
said adjusting means enabling said free running frequency to substantially equal said frequency of said detection pulse train, whereby said frequency detector provides said output signal exhibiting one logic state when said detection pulse train is synchronized with said output signal and a second state when said detection pulse is not synchronized with said output signal.

39. The optical switching device of claim 36, wherein said synchronizing means comprises:
a frequency detector coupled to receive said electrical detection pulse train;
a low pass filter forming a phase locked loop with said frequency detector;
voltage controlled means for generating said local signal exhibiting said free running frequency; and
said adjusting means enabling said free running frequency to substantially equal said frequency of said detection pulse train, whereby said frequency detector provides said output signal exhibiting one logic state when said detection pulse train is synchronized with said output signal and a second logic state when said detection pulse is not synchronized with said output signal.

* * * * *